United States Patent [19]
Heyns et al.

[11] Patent Number: 5,364,472
[45] Date of Patent: Nov. 15, 1994

[54] PROBEMAT CLEANING SYSTEM USING $CO_2$ PELLETS

[75] Inventors: Garrett J. Heyns, Boulder; Terry R. McClure, Kersey; Hugh Nicholl, Berthoud, all of Colo.; Peter H. Read, Morrisville, Pa.; Steven M. Schulte; Mohammad F. Tabrizi, both of Westminster, Colo.

[73] Assignee: AT&T Bell Laboratories, Murray Hill, N.J.

[21] Appl. No.: 95,646

[22] Filed: Jul. 21, 1993

[51] Int. Cl.$^5$ ............. B08B 7/00; B24C 1/00; B24C 3/22; B24C 3/32
[52] U.S. Cl. .............................. 134/7; 134/6; 134/18; 451/78; 451/53; 451/39
[58] Field of Search .............. 134/6, 7, 18; 51/320, 51/322, 413

[56] References Cited
U.S. PATENT DOCUMENTS

| | | | |
|---|---|---|---|
| 3,778,935 | 12/1973 | Callahan et al. | 51/413 |
| 4,535,576 | 8/1985 | Shukla et al. | 51/413 |
| 4,617,064 | 10/1986 | Moore | 134/7 |
| 4,974,375 | 12/1990 | Tada et al. | 51/413 |

Primary Examiner—Richard O. Dean
Assistant Examiner—Zeinab El-Arini
Attorney, Agent, or Firm—John C. Moran

[57] ABSTRACT

A system for cleaning test probes attached to a probe mat fixture by propelling $CO_2$ pellets at the test probes, by rotating the fixture so that the pellets impact different sides of the test probes, and by providing electrostatic protection for active devices mounted on the probemat fixture. The $CO_2$ pellets are propelled so that they strike the test probes at an angle to the horizontal plane of the test probe as mounted on the probemat fixture. Electrostatic protection is provided by connecting all electrical connections to the probemat fixture to ground and by reducing electrostatic charge build up on the probemat fixture by using an ionizer to direct ions at the probemat fixture.

6 Claims, 8 Drawing Sheets

FRONT VIEW

SIDE VIEW

TOP VIEW

SIDE VIEW OF PROBEMAT AND PROBEMAT RECEIVER 110

TOP VIEW OF PROBEMATE AND PROBEMAT RECEIVER 110

PROBEMAT CLEANING SYSTEM USING $CO_2$ PELLETS

TECHNICAL FIELD

This invention relates to a system for cleaning probemat fixtures utilized in automatic circuit pack testing equipment and, in particular, to the utilization of $CO_2$ pellets for cleaning test probes attached to the probemat fixtures.

BACKGROUND OF THE INVENTION

Probemat fixtures, also referred to as a bed-of-nails fixtures, are used in automatic circuit pack testing systems to make electrical contact over the whole surface of a circuit pack. An example of an automatic circuit pack testing system is the GenRad 2276. The average fixture has from 500 to 2000 test probes. As the fixture is used, the ends of the probes become contaminated with material from the circuit packs and cease to make good electric connections. Cleaning with solvents is not possible because each probe is a spring-loaded pin plunger and barrel using a special lubricant. If a solvent was used to clean the test probes, the solvent would remove the lubricant. In addition, the solvent would tend to deposit particles between the barrel and the pin plunger.

In the prior art, probemat fixture maintenance has relied on simply light brushing, vacuuming, and random test probe replacement. Because of the high cost of replacing many test probes, probemat fixture maintenance intervals have often been too long and have resulted in poor testing being performed by the automatic circuit pack test systems. Abrasive cleaning, using sand or other hard materials, is not used because such materials remove the gold or other platings on the test probe surfaces. Abrasive materials also fracture to create dust that greatly shortens the life of the test probes. Further, the probemat fixtures have active electronic circuits permanently mounted on the probemat fixtures, and these active electronic circuits are very susceptible to damage by electrostatic charges being built up on the probemat fixture during cleaning.

The problem of having probemat fixtures whose test probes are not clean of contaminants is a major problem in the area of automatic circuit pack testing systems. Clearly, the cleaning of the test probes is a long outstanding problem within the industry which the prior art has not been able to solve.

SUMMARY OF THE INVENTION

The foregoing problems are solved by a method and apparatus that involves the cleaning of test probes attached to a probe mat fixture by propelling $CO_2$ pellets at the test probes, rotating the fixture so that the pellets impact different sides of the test probes, propelling the $CO_2$ pellets so that they strike the test probes at an angle to the horizontal plane of the test probe as mounted on the probemat fixture, and providing electrostatic protection for active devices mounted on the probemat fixture. After many hours of experimentation, unexpected results have been achieved with respect to the almost total removal of contaminants from the test probes and the absence of wear to the test probes resulting from the impact of the $CO_2$ pellets.

DETAILED DESCRIPTION

Figure 3:
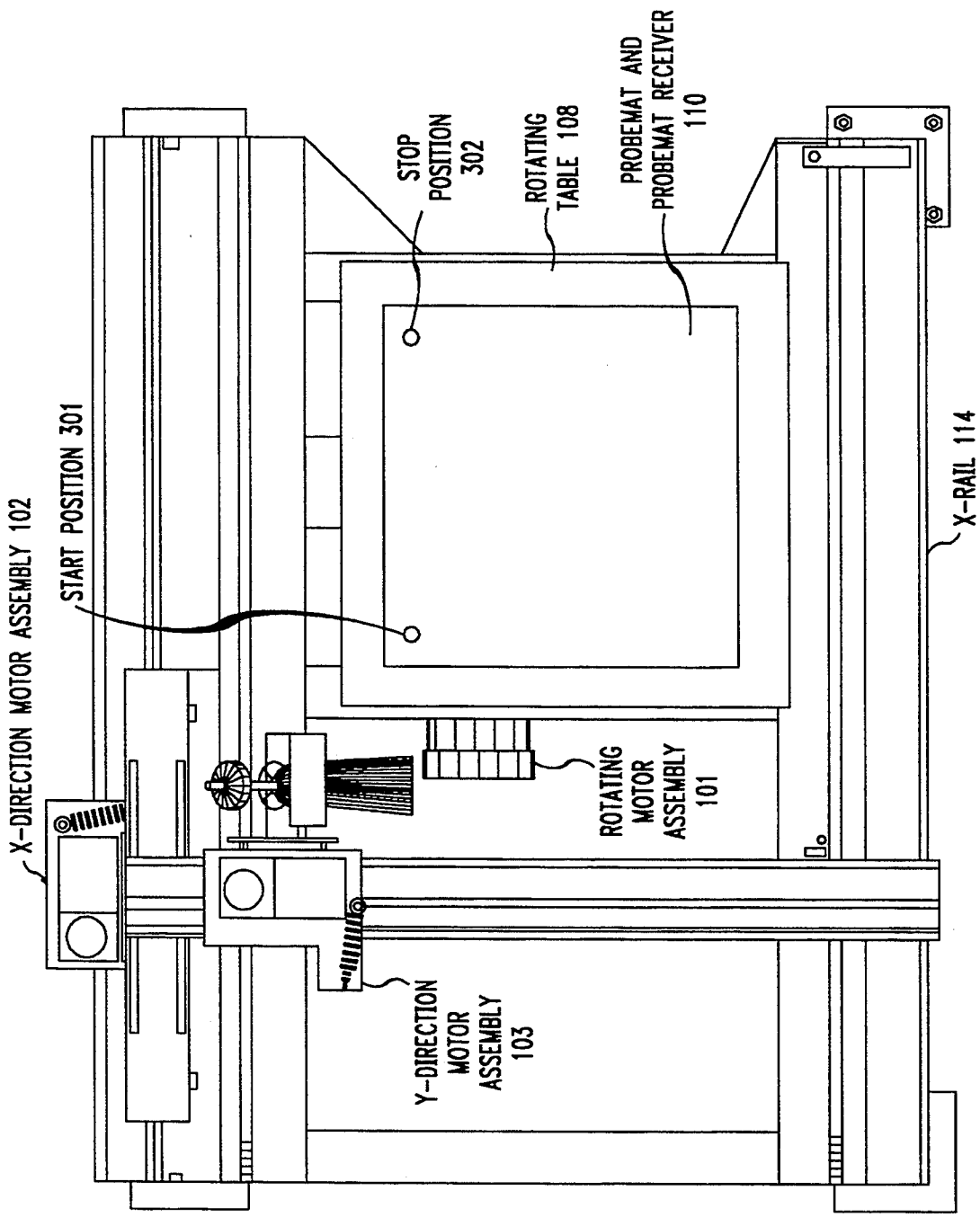
Figure 4:
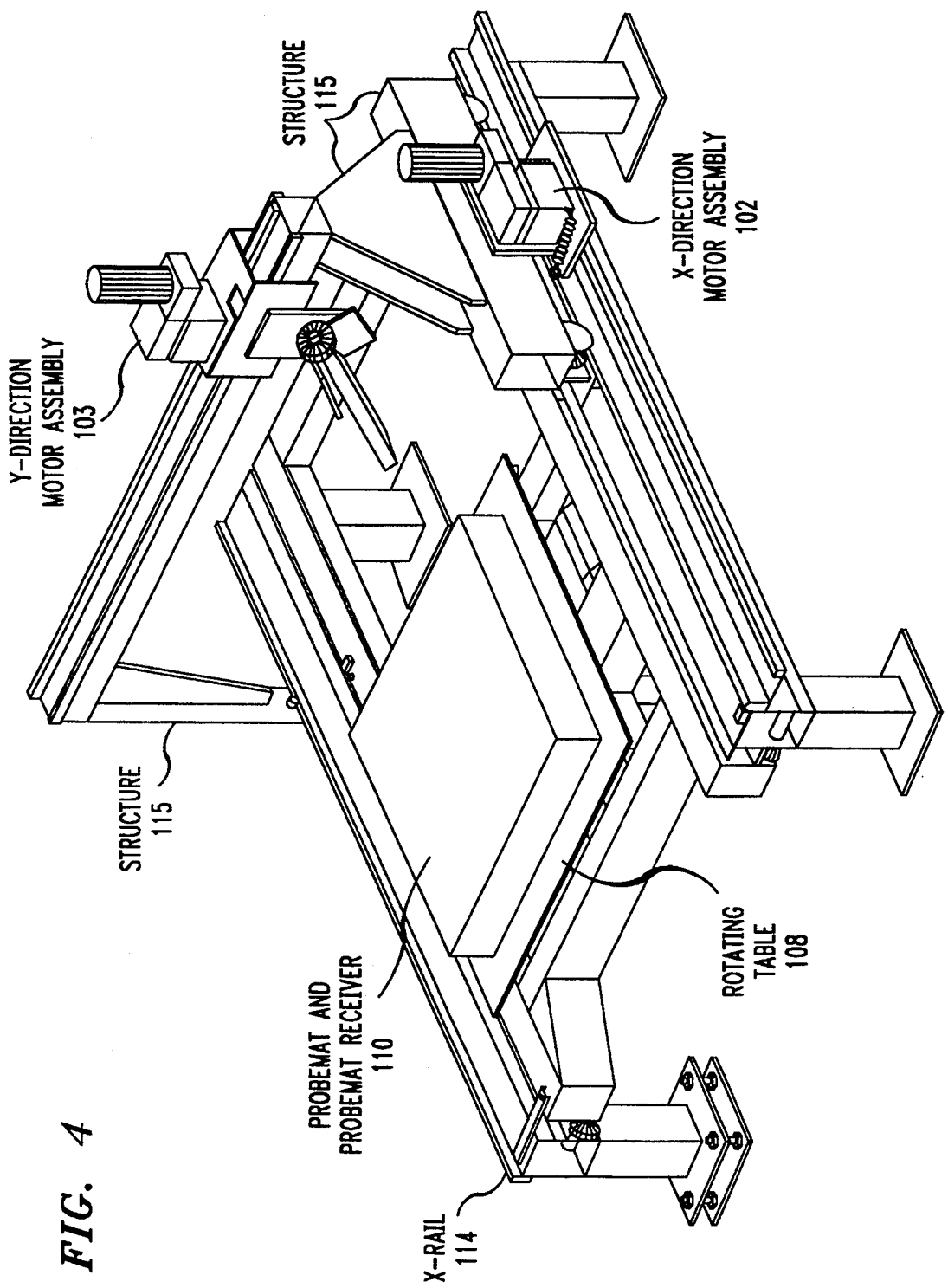
Figure 5:
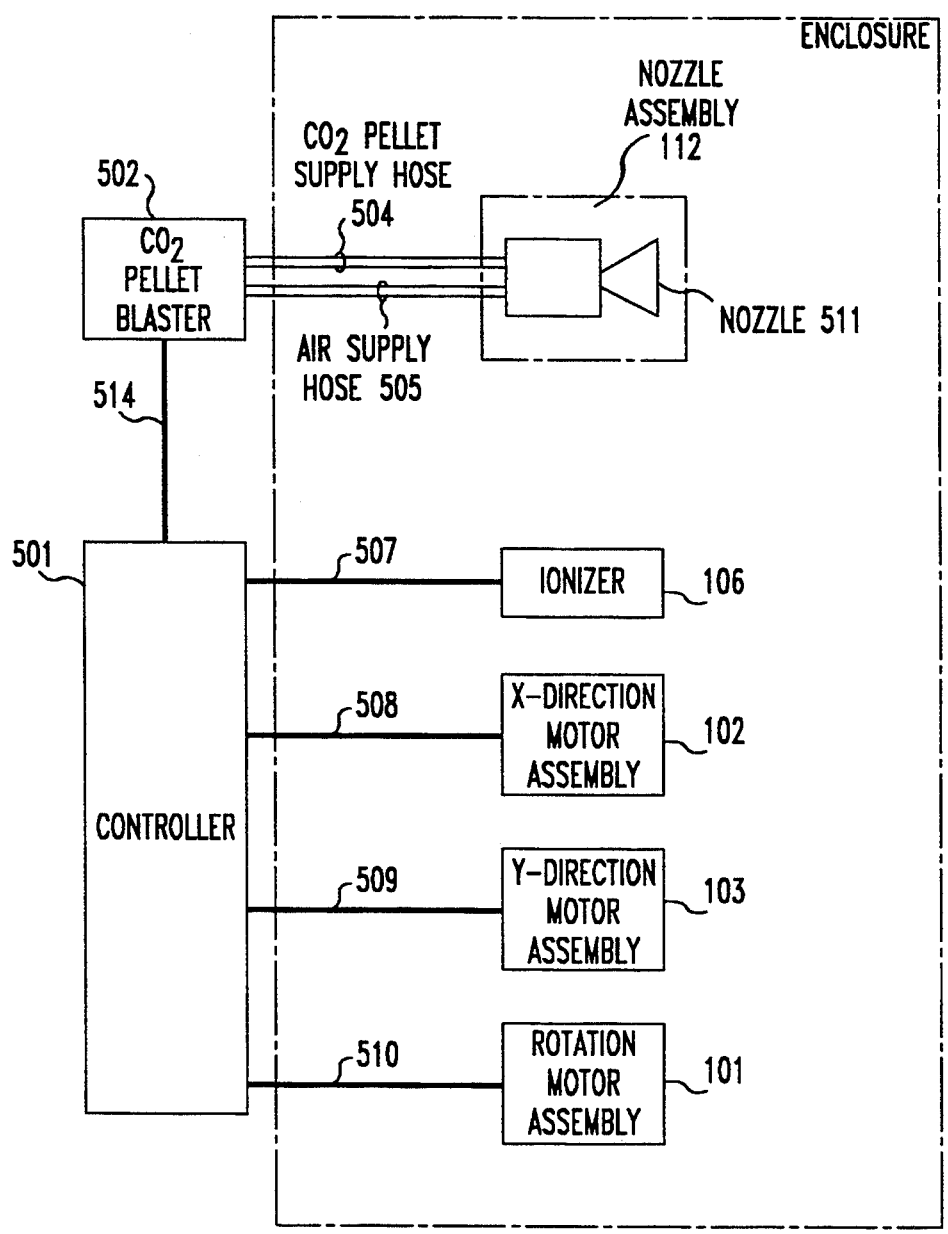
FIG. 5 illustrates, in block diagram form, the cleaning system in accordance with the invention.

FIGS. 1 through 4 illustrate different views of the cleaning system with the exception that controller 501, $CO_2$ pellet blaster 502, and hoses 504 and 505 of FIG. 5 are not illustrated. As illustrated in FIGS. 1 through 4, elements 101 through 115 are enclosed within enclosure 104; whereas, $CO_2$ pellet blaster 502 and controller 501 are located outside of enclosure 104. Controller 501 provides the overall control for the cleaning system. As illustrated in FIG. 5, controller 501 directly controls ionizer 106 via cable 507, x-direction motor assembly 102 via cable 508, y-direction motor assembly 103 via cable 509, and rotation motor assembly 101 via cable 510. In addition, controller 501 controls the flow of air and $CO_2$ pellets from nozzle 511 by controlling $CO_2$ blaster 502 via cable 514. Advantageously, ionizer 106 may be a device such as Aerostat XC that is manufactured by Simco Inc. $CO_2$ pellet blaster 502 and nozzle assembly 112 may advantageously be a unit similar to Cryogensis model 1350-2 manufactured by Waste Minimization and Containment Services Inc. The standard Cryogensis model 1350-2 has been modified to include a pneumatic valve in place of a manual valve so that controller 501 can control the delivery of air to nozzle assembly 112 via air supply hose 505. $CO_2$ pellet blaster 502 also has been modified to have an electrical-to-pneumatic control device so as to control the pneumatic valve in response to electrical signals from controller 501 via cable 514.

Figure 1:
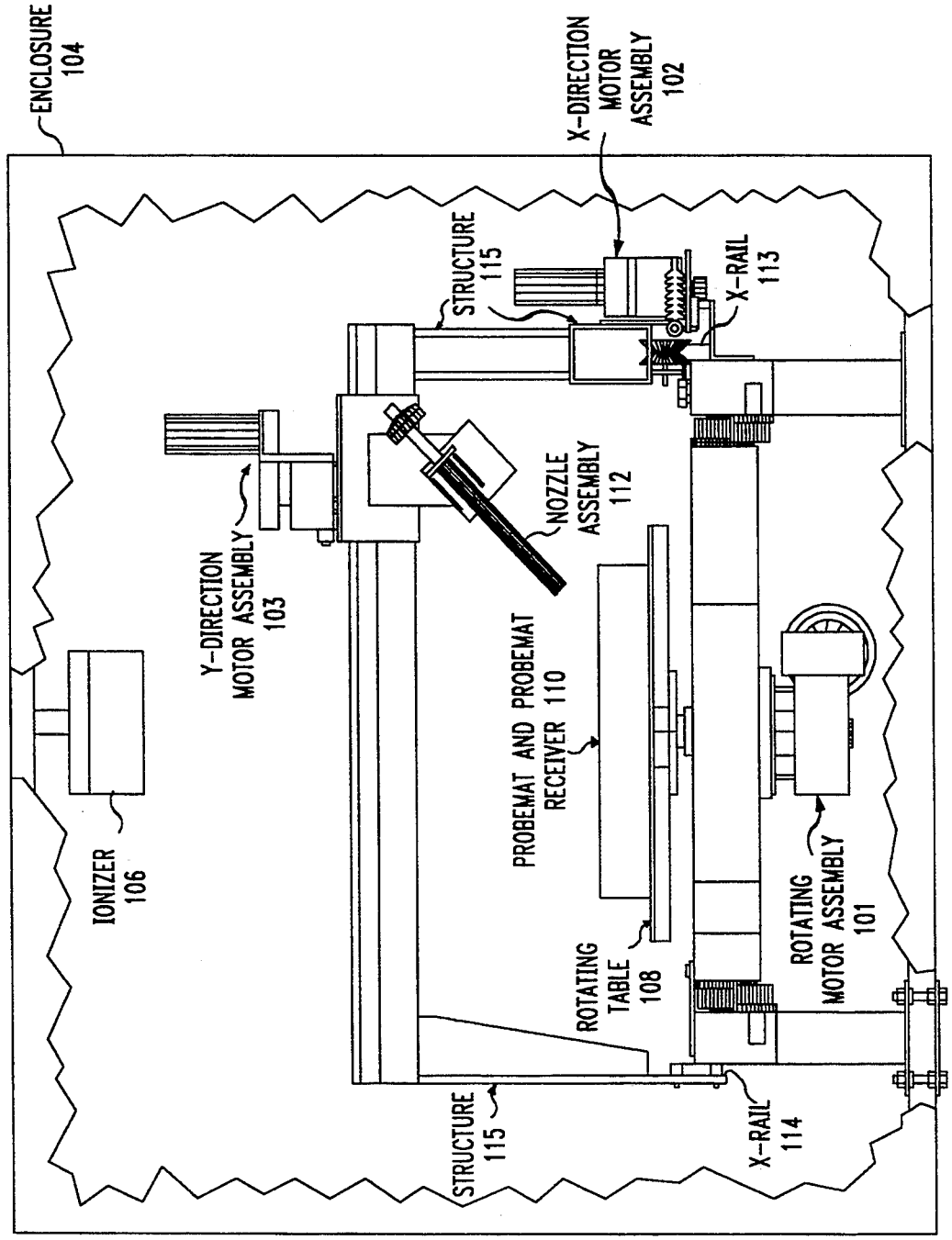
FIGS. 1 through 4 illustrate electrical, mechanical, and pneumatic elements of a portion of the cleaning system in accordance with the invention.

Nozzle bracket 111 secures nozzle assembly 112 to y-direction motor assembly 103. As illustrated in FIG. 1, y-motor assembly 103 is moved under control of controller 501 along y-rail 107. Nozzle bracket 111 can be manually adjusted to adjust the height and angle of nozzle assembly 112 with respect to probemat and probemat receiver 110.

As illustrated in FIGS. 1 and 4, x-direction motor assembly 102 is attached to structure 115 which supports y-rail 107. Structure 115 is propelled along x-rail 113 and x-rail 114 by x-direction motor assembly 102 under control of controller 501.

Probemat and probemat receiver 110 is attached to rotating table 108. Rotating table 108 can be rotated 360 degrees by rotating motor assembly 101 under control of controller 501. All elements illustrated in FIG. 1 through 4 have their frames electrically connected together and are connected to earth ground for electrostatic protection. In addition, at the end of the cleaning cycle, ionizer 106 projects a stream of 50% positive and 50% negative ions down on probemat and probemat receiver 110 to neutralize electrostatic charge build up on the non-conductive surface of probemat and probemat receiver 110.

Figure 2:
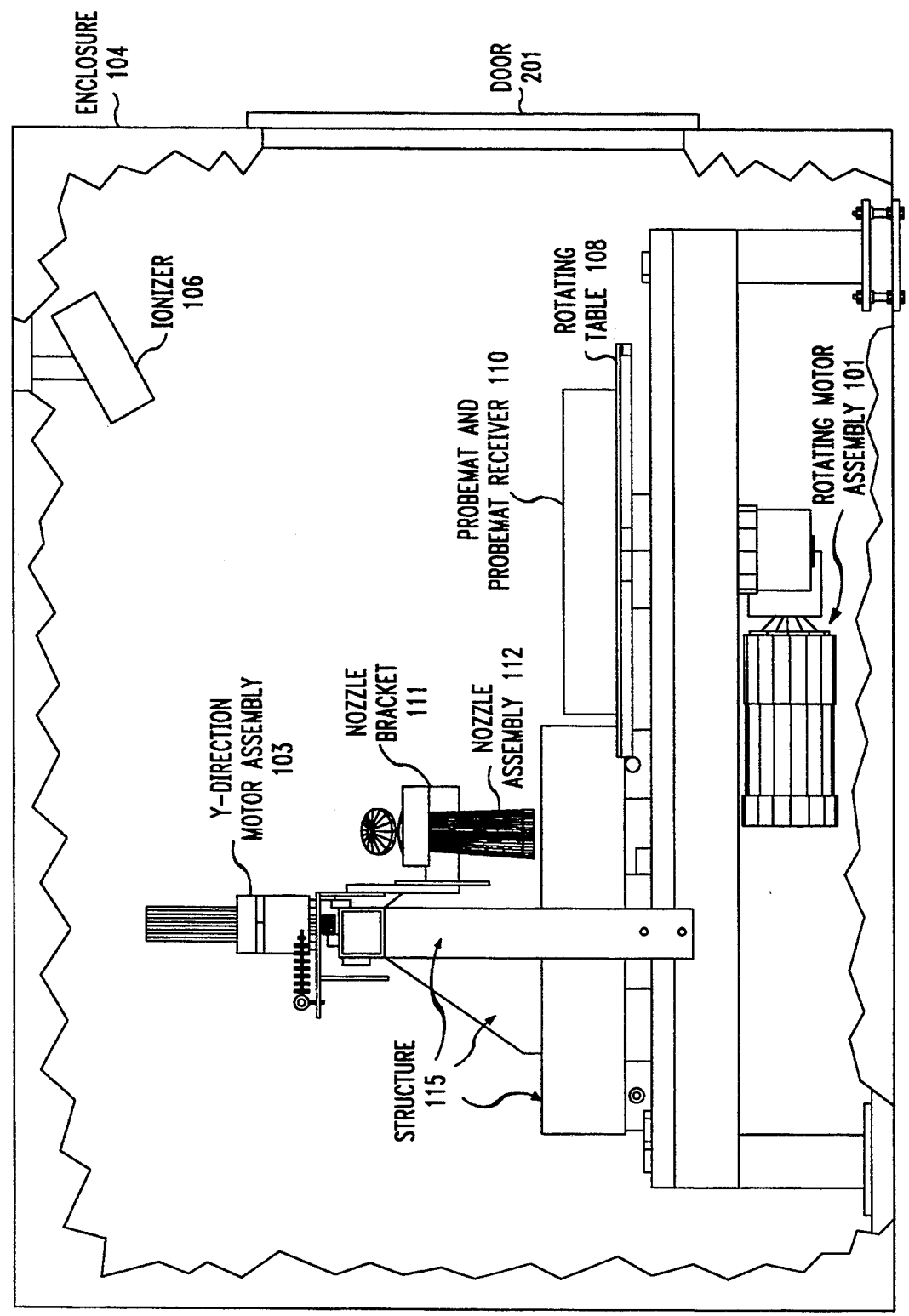

As illustrated in FIG. 2, door 201 provides access for an operator to access probemat and probemat receiver 110 to remove and install probemats. A duct for exhausting air from enclosure 104 is not illustrated in FIGS. 1 and 2. The air from enclosure 104 is exhausted to outside of the building in which enclosure 104 is located after the air has been filtered to capture debris from the probemats.

Figure 6:
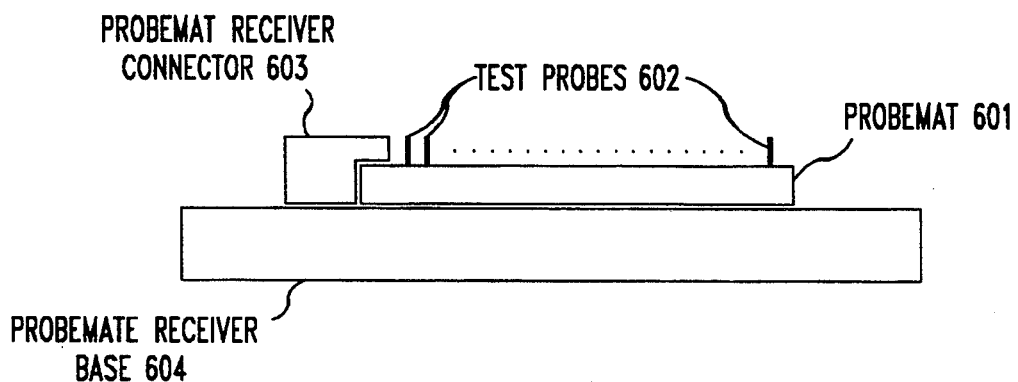
FIG. 6 and 7 illustrate views of the probemat and probemat receiver of FIGS. 1 through 4.
Figure 7:
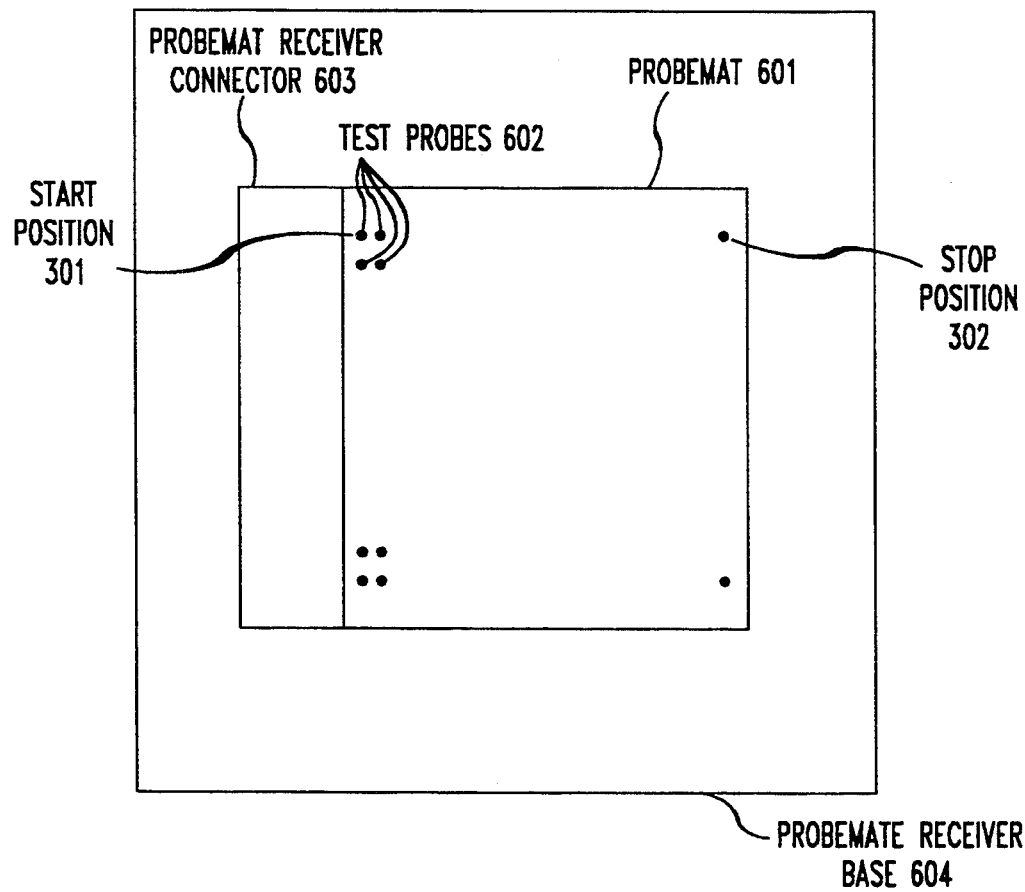

FIGS. 6 and 7 illustrate side and top views of probemat and probemat receiver 110, respectively. Probemat receiver connector 603 is attached to probemat receiver base 604 which in turn is attached to rotating table 108. Probemat receiver connector 603 may advantageously be an Augat pylon connector for utilization with probemats for GenRad model GR2276 automatic circuit pack test system. Not illustrated in FIG. 6 is the fact that probemat 601 has connection pins which are inserted into a shorting material within probemat receiver connector 603. Also not illustrated in FIG. 6, is the mechanism utilized to lock probemat 601 into probemat receiver connector 603. FIG. 6 and 7 illustrate that there are a plurality of test probes 602 located on probemat 601. It should be noted, that test probes 602 are not of necessity organized in columns and rows but may be scattered randomly across the surface of probemat 601.

With respect to the top view illustrated in FIG. 3, consider now the operations performed in cleaning a probemat under control of controller 501. First, controller 501 activates $CO_2$ pellet blaster 502. In response, $CO_2$ pellet blaster 502 supplies air to air supply hose 505 and then, delivers $CO_2$ pellets to $CO_2$ pellet supply hose 504. Controller 501 then controls x-direction motor assembly 102 and y-motor assembly 103 to position nozzle assembly 112 such that $CO_2$ pellets leaving nozzle 511 impact on start position 301. Next, controller 501 controls x-direction motor assembly 102 to move structure 115 to the right in FIG. 3 causing nozzle assembly 112 to transverse the probemat and probemat receiver 110 in the x-direction towards stop position 302. After nozzle assembly 112 reaches position 302, controller 501 controls y-direction motor assembly 103 to move in the y-direction (down as illustrated in the top view of FIG. 3) and then activates x-direction motor assembly 102 to transverse the probemat and probemat receiver 110 to the left going back to a position below start position 301. The y-direction movement is an incremental movement. The distance moved is determined such that the entire area of probemat and probemat receiver 110 is uniformly cleaned. After the entire probemat and probemat receiver 110 have been transversed in this manner, rotating table 108 then rotates 90 degrees; and the process is repeated to transverse the entire probemat and probemat receiver 110 again. The sequence of transversing the entire probemat and probemat receiver 110 and then rotating rotating table 108 is repeated until all four sides of probemat and probemat receiver 110 have been cleaned by the impact of $CO_2$ pellets.

After all four sides have been cleaned in this manner, controller 501 controls $CO_2$ pellet blaster 502 to shut off the supply of $CO_2$ pellets to $CO_2$ pellet supply hose 504 and to simply supply air to nozzle assembly 112 via air supply hose 505. The above sequence of transversing the entire probemat and probemat receiver 110 and then rotating the probemat and probemat receiver 110 until all four sides have been cleaned is now repeated with only air exiting from nozzle assembly 112. The purpose of pure air is to blow off any condensation that may be present on the probemat due to the cleaning process.

Finally, controller 501 returns the nozzle assembly 112 to the nozzle home position illustrated in FIG. 3 by controlling x-direction motor assembly 102 and y-direction motor assembly 103. The position illustrated in FIG. 3 of nozzle assembly 112 is referred to as the nozzle home position. Controller 501 actuates ionizer 106 to direct a stream of ions at probemat and probemat receiver 110 for a 1 minute ionization dwell. The operator can now remove the probemat 601 from probemat receiver connector 603 and insert a new probemat.

Figure 8:
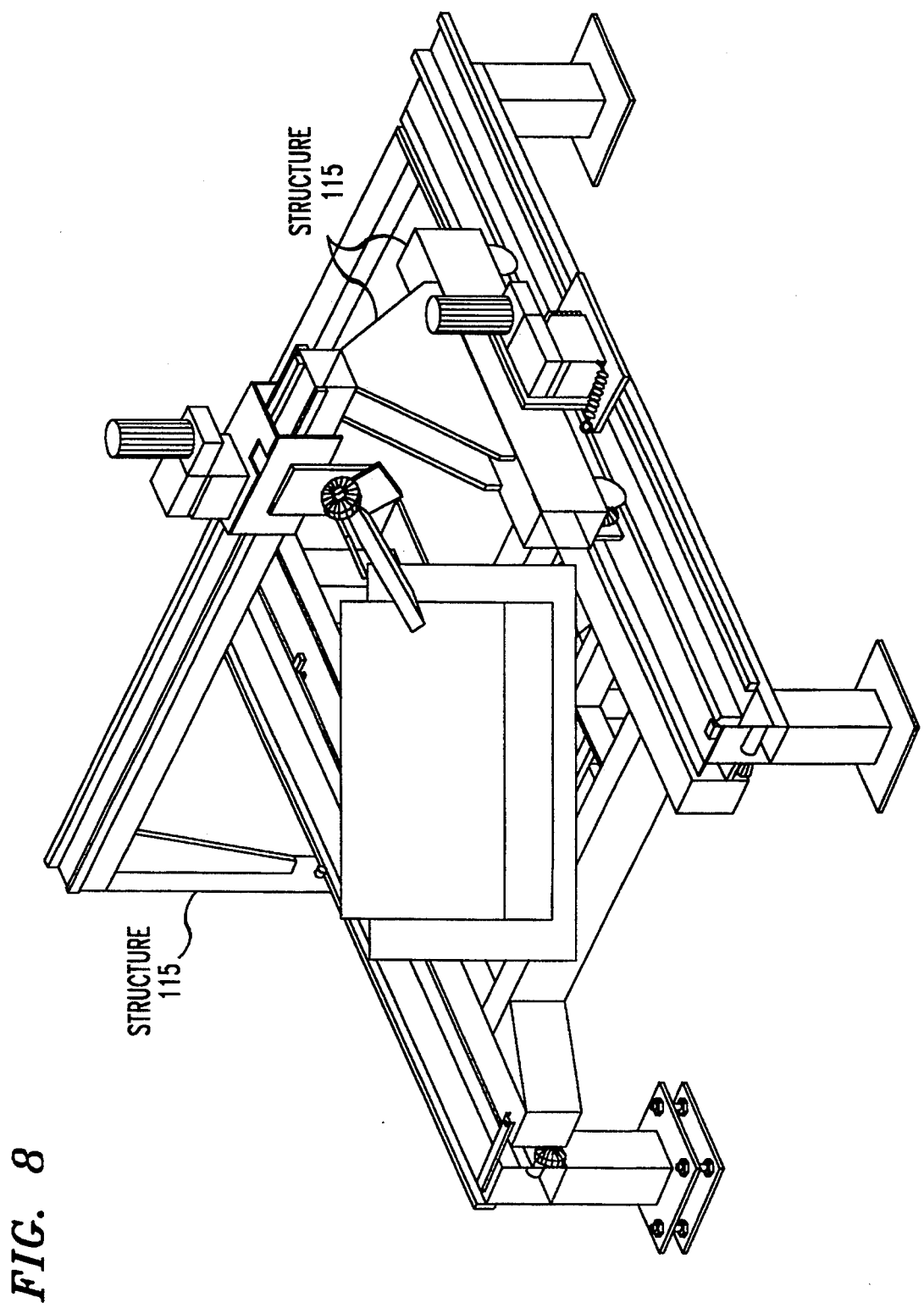
FIG. 8 illustrates, in a perspective form, a portion of the cleaning system in operation.

FIG. 8 illustrates the rotation of rotate table 108 between 0 degrees and 90 degrees with rotate table 108 being illustrated in the 45 degrees rotation position.

Figure 9:
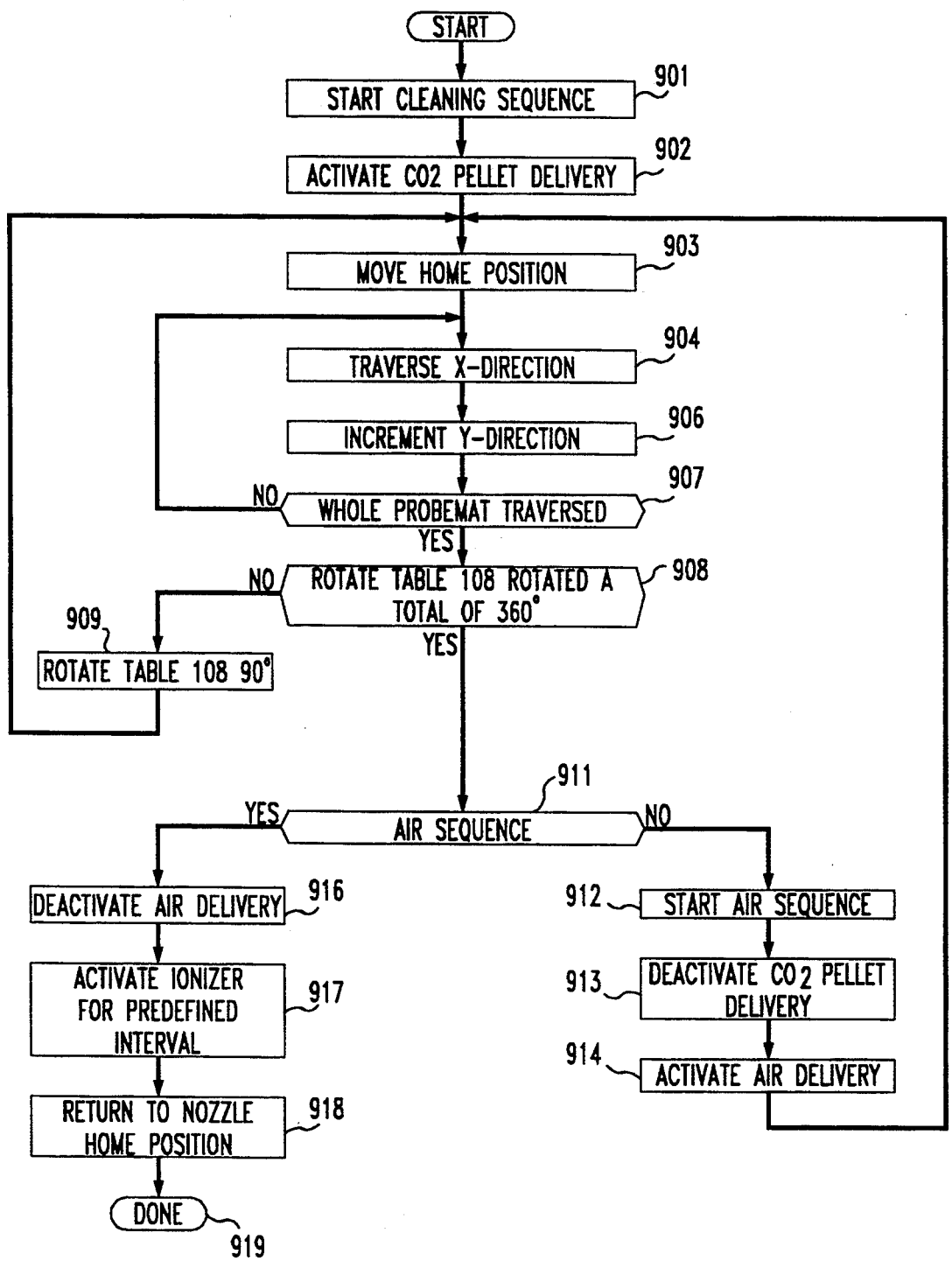

FIG. 9 illustrates, in flow chart form, the operations performed under control of controller 501. Controller 501 may be any industrial controller which is programmed to perform the operations illustrated in FIG. 9 and has the proper electrical interfaces to control $CO_2$ pellet blaster 502, ionizer 106, x-direction motor assembly 102, y-direction motor assembly 103, and rotation motor assembly 101.

The program executed by controller 501 is illustrated in flow chart form in FIG. 9. First, block 901 is executed to designate that the cleaning sequence is being executed. Block 902 activates the delivery of $CO_2$ pellets from nozzle assembly 112. Block 903 activates x-direction motor assembly 102 and y-direction motor assembly 103 so that the impact of the $CO_2$ pellets being delivered from nozzle 511 is onto start position 301 as illustrated in FIG. 3. Block 904 then traverses in the x-direction by controlling x-direction motor assembly 102 to move the impact of the $CO_2$ pellets a distance equal to the distance between start position 301 and stop position 302 illustrated in FIG. 3. Block 906 increments y-direction motor assembly 103 in the y-direction by a predefined distance which would be a downward increment as illustrated in FIG. 3. Decision block 907 determines if the entire probemat has been traversed. If the answer is no, block 904 is executed again. If the answer is yes, control is passed to decision block 908.

Decision block 908 determines whether rotate table 108 has been rotated a total of 360 degrees for this particular cleaning or air sequence. If the answer is no, control is transferred to block 909 which controls rotate table 108 to rotate that table 90 degrees; and then, the sequence 903 through 908 is repeated. If the answer to decision block 908 is yes, control is transferred to decision block 911.

Decision block 911 determines whether the air or cleaning sequence was being executed. If the air sequence was being executed, then the operations with respect to this particular probemat are finished with the exception of executing blocks 916 through 919. Block 916 deactivates the delivery of air to nozzle 511, and block 917 activates ionizer 106 for 1 minute. Finally, block 918 returns nozzle assembly 112 to the home nozzle position.

If the cleaning sequence was being executed, decision block 911 transfers control to block 912 to start the air sequence. The air sequence causes the $CO_2$ pellets to cease from being delivered to nozzle assembly 112 and for only air to be delivered to that assembly. The purpose of the air sequence is to transverse the entire probemat board to blow off condensation which resulted from the impinging of $CO_2$ pellets onto the test probes of the probemat. Block 912 starts the air sequence. Block 913 deactivates the delivery of $CO_2$ pellets to nozzle assembly 112, and block 914 activates the delivery of air only to nozzle assembly 112. Finally, control is transferred from block 914 to block 903 for execution of the operations defined by blocks 903 through 911 which have already been described.

It is to be understood that the above-described embodiment is merely illustrative of the principles of this invention; other arrangements may be devised by those skilled in the art without departing from the spirit and scope of the invention. In particular, one skilled in the art could readily envision rotating the table in less or more than 90 degrees between the cleaning sequence operations. Further, one skilled in the art could readily adapt the apparatus for cleaning other types of probemats than those specified within the embodiment.

We claim:

1. An apparatus for cleaning electrical test probes attached to a testing fixture, comprising:

a controller for controlling the operation of the apparatus;

a fixture receiver for mechanically securing the testing fixture and for electrically connecting all electrical connections of the testing fixture to ground thereby providing electrostatic protection for the testing fixture;

a rotating table moved by a first motor that is controller by the controller to rotate the rotating table and the fixture receiver is mechanically secured to the rotating table;

a first structure adapted for being propelled along two rails in a first axis by a second motor under control of the controller;

a second structure adapted for being propelled along a rail attached to the first structure in a second axis by a third motor under control of the controller;

a nozzle attached to the second structure with the nozzle, second structure and first structure being positioned with respect to the rotating table such that the nozzle is pointed at the testing fixture secured to the rotating table;

means for propelling $CO_2$ pellets from the nozzle onto the testing fixture under control of the controller;

the controller adapted to impinge all test probes on a plurality of sides with $CO_2$ pellets by controlling the propelling means, first motor, second motor, and third motor;

an ionizer for reducing electrostatic charge build up on the testing fixture by directing ions at the testing fixture under control of the controller the propelling means further capable of propelling only air from the nozzle onto the testing fixture under control of the controller; and the controller further adapted for propelling air onto the plurality of sides of all test probes to remove condensation from the test probes by controlling the propelling means, first motor, second motor, and third motor.

2. The apparatus of claim 1 wherein the $CO_2$ pellets impinge at an angle to the horizontal axis of the testing probes of greater than zero degrees and less than ninety degrees.

3. The apparatus of claim 2 wherein the plurality of sides is four with each side being 90 degrees from the next side.

4. A method for cleaning electrical test probes attached to a testing fixture, comprising:

mechanically securing the testing fixture to a fixture receiver;

electrically connecting all electrical connections of the testing fixture to ground by the fixture receiver thereby providing electrostatic protection for the testing fixture;

rotating a table by a first motor that is controlled by the controller and the fixture receiver is mechanically secured to the table;

propelling a first structure along two rails in a first axis by a second motor under control of the controller;

propelling a second structure along a rail attached to the first structure in a second axis by a third motor under control of the controller;

attaching a nozzle to the second structure with the nozzle, second structure and first structure being positioned with respect to the table such that the nozzle is pointed at the testing fixture secured to the rotating table;

propelling $CO_2$ pellets from the nozzle by a supply device onto the testing fixture under control of the controller;

impinging all test probes on a plurality of sides with $CO_2$ pellets by the controller controlling the supply device, first motor, second motor, and third motor;

reducing electrostatic charge build up on the testing fixture by an ionizer that directs ions at the testing fixture under control of the controller and the supply device further capable of propelling only air from the nozzle onto the testing fixture under control of the controller and the method further comprises removing condensation from the test probes by propelling air onto the plurality of sides of all test probes by the controller controlling the supply device, first motor, second motor, and third motor.

5. The method of claim 4 wherein the $CO_2$ pellets impinge at an angle to the horizontal axis of the testing probes of greater than zero degrees and less than ninety degrees.

6. The method of claim 5 wherein the plurality of sides is four with each side being 90 degrees from the next side.

* * * * *